United States Patent [19]

Le Seigneur

[11] 3,720,880

[45] March 13, 1973

[54] POWER AMPLIFYING DEVICE FOR AMPLITUDE MODULATED HIGH FREQUENCY SIGNALS

[75] Inventor: Pierre Le Seigneur, Paris, France

[73] Assignee: Thomson-CSF, Paris, France

[22] Filed: Oct. 13, 1971

[21] Appl. No.: 188,812

[30] Foreign Application Priority Data

Oct. 3, 1970 France....................................7036925

[52] U.S. Cl. ......................330/29, 330/123, 330/136, 330/139

[51] Int. Cl. ...............................................H03g 3/30

[58] Field of Search......330/15, 22, 29, 40, 123, 136, 330/128, 139; 325/319; 332/37

[56] References Cited

UNITED STATES PATENTS

| | | | |
|---|---|---|---|
| 3,443,241 | 5/1969 | Pitzaus | 330/29 |
| 3,486,128 | 12/1969 | Lohrmann | 330/40 |
| 3,426,266 | 2/1969 | Day et al. | 307/297 X |

*Primary Examiner*—Roy Lake
*Assistant Examiner*—James B. Mullins
*Attorney*—Edwin E. Greigg

[57] ABSTRACT

In a power amplifying device comprising a linear push-pull amplifier the transistors of which are mounted in a common emitter arrangement, the difference between the d.c. supply voltage and the variable peak voltage $V_m$ appearing on the collectors of the transistors for each period of the input signal, is maintained constant through supplying to the amplifier a d.c. supply voltage $V_a$ equal to $V_m + V_D$ where $V_D$ is a predetermined voltage.

This is obtained through detecting the peak values of the input signal by means of a peak detector whose output signal is amplified by an auxiliary amplifier, the output voltage of which is supplied as a d.c. supply to the push-pull amplifier.

A feedback circuit maintain the relation $V_a = V_m + V_D$ when the gain of the transistors of the push-pull amplifier varies.

2 Claims, 1 Drawing Figure

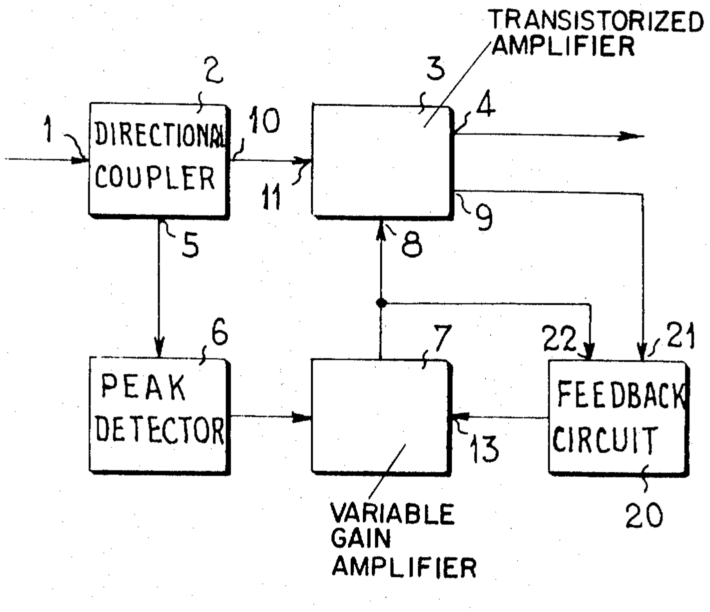
TRANSISTORIZED AMPLIFIER
DIRECTIONAL COUPLER
PEAK DETECTOR
FEEDBACK CIRCUIT
VARIABLE GAIN AMPLIFIER
1
2
3
4
5
6
7
8
9
10
11
13
20
21
22

POWER AMPLIFYING DEVICE FOR AMPLITUDE MODULATED HIGH FREQUENCY SIGNALS

The present invention relates to transistorized power amplifying devices for amplitude modulated high frequency signals, and more particularly to those used in single side band transmitters.

It is well known that the efficiency of these amplifiers is low, primarily because of the high linearity which is required of them up to the maximum modulated power, and of the fact that this maximum modulated power only occurs for a very small percentage of the time in the case of the modulation signals conventionally used, for example voice signals.

Experience has shown that the mean power thus obtained is only a tenth of said maximum power, this corresponding essentially to an efficiency of the order of 20 percent.

The object of the present invention is to overcome this drawback.

According to the invention, there is provided a power amplifying device for amplifying an amplitude modulated high frequency signal, said device comprising a linear transistorized amplifier including at least one transistor and having a signal input and a d.c. supply input, and means for delivering to said d.c. supply input a voltage whose value is a linear function of the level of the envelope signal of said high frequency signal.

The invention will be better understood and other of its features rendered apparent, from a consideration of the ensuing description and the appended drawings which is a block diagram of an amplifying device in accordance with the invention.

In the figure, the signal to be amplified is applied to the input 1 of a directional coupler 2 ; an output 10 of this coupler is coupled to the signal input 11 of a transistorized class AB push-pull amplifier 3 ; the output 4 of this amplifier is the output of the device. A fraction of the input signal of the coupler 2 , delivered by the output 5 thereof, is applied to a peak detector 6 , the output current of which feeds a variable gain auxiliary amplifier 7 , the output of which is connected to the supply input 8 of the amplifier 3 .

A feedback circuit which will be described hereinafter couples the output of the amplifier 7 to the gain control input thereof.

The amplifier 3 is the final stage of a conventional high frequency push-pull linear class AB amplifier with two transistors, or two sets of several transistors arranged in parallel, connected symmetrically in common emitter configuration.

In known art, the power stages operate with a constant d.c. supply voltage. If the input signal of the amplifier were an unmodulated sine wave the peak voltage on the collectors of the transistors for each period of the HF signal would have a constant value $V_M$ ; and so would have the residual voltage $V_D = V_A - V_M$ where $V_A$ is the supply voltage.

With an amplitude-modulated input signal, the peak voltage has a variable value $V_m$ which is a function of the modulation level, i.e., of the level of the envelope signal of the input signal of the amplifier. $V_A$ must be high enough for the maxima of the modulating signal, and the residual voltage, which is a cause of a loss of efficiency, is unnecessarily high most of the time.

The system described makes it possible to operate at a constant loss voltage $V_D$ and thus at optimum efficiency, by substituting for the fixed supply voltage $V_A$ a variable supply voltage $V_a$ ($V_a$      $V_A$) such that :

$$V_a = V_m + V_D .$$

This result is achieved in the following way :

Since the amplifier 3 is a linear one, there corresponds to each peak voltage $V_m$ an output power $P_s$ and an input power $P_e$ such that :

$P_s/P_e = G$ and $V_m = K_1 \quad P_s = K_1 \quad G.P_e$ where $K_1$ is a parameter which is a function of the load impedance presented to the power transistors.

The coupler 2 produces a current $I$ proportional to $P_e$ , i.e. :

$I = K_2 \quad P_e$ and the peak detector 6 produces a current $I_m$ in accordance with a similar law :

$$I_m = K_3 \quad P_e ,$$

$K_2$ and $K_3$ being constant coefficients.

The auxiliary amplifier 7 produces a voltage $V_a$ of the form $V_a = K_4 I_m + V_{ct}$ , where $V_{ct}$ has a constant value thence $V_a = K_4 K_3 \quad P_e + V_{ct}$ .

If the gain $K_4$ of the amplifier 7 is given a value such that $K_3 K_4 = K_1 \quad G$ and the constant voltage $V_{ct}$ is chosen equal to $V_D$ , there is obtained $$V_a = K_1 \quad G \times P_e + V_D = V_m + V_D .$$

In practice, it is necessary to take into account the variation in the gain $G$ of the transistors as a function of the frequency of the high frequency signal carrying the information, or of the variations in environmental temperature of the transistors, so that $K_4$ must be made to vary as a function of $G$ .

Such is the object of the feedback loop comprising the circuit 20 , the two inputs 22 and 21 of which are respectively connected to the output of the amplifier 7 , and to an auxiliary output 9 of the amplifier 3 , which auxiliary output 9 is connected to the collector of one of the transistors of the amplifier 3 .

By means of a peak detector, fed by the input 21 , the circuit 20 supplies a voltage $- V_m$ which is added to the output voltage $V_a$ of the amplifier 7 to supply the residual voltage $V_a - V_m$ . This is compared with the predetermined constant value $V_D$ for the obtention of an error signal which is applied by the output of the circuit 20 to the gain control input of the amplifier 7 so that the output voltage thereof always remain equal to $V_m + V_D$ .

The improvement in efficiency is very high. This is obtained without loss of linearity since the transistors of the power stage still operate in their linear range.

It will be noted that it is possible to eliminate the elements 2 and 6 from the circuit of the figure, to apply a constant voltage $V_o$ to the signal input of the amplifier 7 , and to obtain $V_a$ only by means of the feedback circuit. However, difficulties are then encountered as concerns the stability of the feedback loop. Those difficulties are avoided with the preferred embodiment which has been described.

The component parts of the circuit described can be of any known type. However, as far as the auxiliary amplifier 7 is concerned, the design has an effect upon the way in which the invention can be exploited.

With a conventional auxiliary amplifier 7 , directly amplifying the analogue signal from the peak detector 6 , the power not taken by the power stage is absorbed in the ballast constituted by the transistors of the final stage of the analogue amplifier.

The overall efficiency of course remains unchanged in relation to that of the conventional circuit but the power dissipated by the transistors of the high frequency power stage is much lower and the reliability is improved.

This kind of design is intended more particularly for high-power transmitters (several kilowatts for example).

An auxiliary class D amplifier, that is to say one associated with a device for converting the analogue signal into width-modulated pulses at its input and vice versa at its output, can easily be provided for medium power transmitters. An efficiency in the order of 90 percent can then be obtained so that the overall efficiency is around twice that of a conventional circuit and one has a choice between the following practical advantages :

increased independence on the part of a portable transmitter for the same powerpack volume;

increased transistor reliability for the same cooling radiator mass;

reduction in the radiator mass and the volume of the powerpact, in the case of on-board equipment.

What is claimed is :

1. A power amplifying device for amplifying an amplitude modulated high frequency signal, said device comprising : a coupler having an input for receiving said high frequency signal, a first output and a second output ; a linear transistorized amplifier having a signal input connected to said first output, a d.c. supply input, a main output for delivering the amplified signal and an auxiliary output ; a peak detector having an input connected to said second output of said coupler, and an output ; a variable gain amplifier having a gain control input, a signal input connected to said peak detector output and an output connected to said d.c. supply input of said transistorized amplifier ; a feedback circuit for maintaining at a constant value the difference between the output voltage of said variable gain amplifier and the instantaneous level of the envelope signal of said amplified signal, said feedback circuit having an input connected to the output of said variable gain amplifier, a further input coupled to said auxiliary output of said transistorized amplifier, and an output coupled to said gain control input.

2. A power amplifying device as claimed in claim 1, wherein said variable gain amplifier is an amplifier directly amplifying the output current from said peak detector.

* * * * *